United States Patent
Maede

(10) Patent No.: US 8,026,607 B2
(45) Date of Patent: Sep. 27, 2011

(54) SEMICONDUCTOR APPARATUS

(75) Inventor: Jun Maede, Kyoto (JP)

(73) Assignee: Rohm Co., Ltd. (JP)

( * ) Notice: Subject to any disclaimer, the term of this patent is extended or adjusted under 35 U.S.C. 154(b) by 470 days.

(21) Appl. No.: 12/330,085

(22) Filed: Dec. 8, 2008

(65) Prior Publication Data
US 2009/0152728 A1    Jun. 18, 2009

(30) Foreign Application Priority Data

Dec. 6, 2007 (JP) .............. JP2007-316342

(51) Int. Cl.
H01L 23/52 (2006.01)
H01L 23/48 (2006.01)
H01L 29/40 (2006.01)

(52) U.S. Cl. ............. 257/758; 257/E23.151; 257/774; 257/762; 438/118

(58) Field of Classification Search ........... 257/E23.151, 257/E23.141, E23.143, E23.145, 758, 773–776, 257/759, 760, 762; 438/118, 622
See application file for complete search history.

(56) References Cited

U.S. PATENT DOCUMENTS

| | | | |
|---|---|---|---|
| 6,689,644 B2 * | 2/2004 | Johnson ............. | 438/131 |
| 6,704,235 B2 * | 3/2004 | Knall et al. ............ | 365/225.7 |
| 6,740,947 B1 * | 5/2004 | Bhattacharyya et al. ..... | 257/421 |
| 6,767,816 B2 * | 7/2004 | Kleveland et al. ........... | 438/600 |
| 6,780,683 B2 * | 8/2004 | Johnson et al. .............. | 438/128 |
| 6,919,613 B2 * | 7/2005 | Seyyedy et al. .............. | 257/530 |
| 7,042,035 B2 * | 5/2006 | Rinerson et al. ............. | 257/295 |
| 7,229,921 B2 * | 6/2007 | Hironaga et al. ............ | 438/687 |
| 7,488,625 B2 * | 2/2009 | Knall ............................ | 438/131 |
| 7,768,128 B2 * | 8/2010 | Cho et al. ...................... | 257/758 |
| 7,863,598 B2 * | 1/2011 | Sugita et al. ...................... | 257/5 |
| 7,897,453 B2 * | 3/2011 | Chen et al. .................... | 438/237 |
| 7,923,809 B2 * | 4/2011 | Onda et al. .................... | 257/508 |

FOREIGN PATENT DOCUMENTS

JP    11-150114    6/1999

* cited by examiner

Primary Examiner — Chris Chu
(74) Attorney, Agent, or Firm — Cantor Colburn LLP

(57) ABSTRACT

A semiconductor apparatus has a configuration in which multiple copper wiring layers and multiple insulating layers are alternately layered. A low-impedance wiring is formed occupying a predetermined region. A first wiring pattern includes multiple copper wiring members arranged in parallel with predetermined intervals in a first copper wiring layer, each of which has a rectangular shape extending in a first direction. A second wiring pattern includes multiple copper wiring members arranged in parallel with predetermined intervals in a second copper wiring layer adjacent to the first copper wiring layer, each of which has a rectangular shape extending in a second direction orthogonal to the first direction. The region occupied by the first wiring pattern and that occupied by the second wiring pattern are arranged such that they at least overlap. The first wiring pattern and the second wiring pattern are electrically connected so as to have the same electric potential.

9 Claims, 3 Drawing Sheets

SEMICONDUCTOR APPARATUS

BACKGROUND OF THE INVENTION

1. Field of the Invention

The present invention relates to a semiconductor apparatus, and particularly to a semiconductor apparatus employing copper as a wiring material.

2. Description of the Related Art

In recent years, improved fine semiconductor processes employ copper wiring. Copper wiring has a problem in that it is difficult to directly etch the copper using a mask formed of resist. Accordingly, the copper wiring is formed as follows. That is to say, grooves (openings) are formed in an insulating layer, and a copper wiring film is formed on the entire area of a substrate using a sputtering method or a CVD method. Subsequently, the surface of the wiring film is ground down to the upper face of the wiring film.

Such a copper wiring process has a problem of so-called "dishing", which is a phenomenon in which the copper wiring has irregularities in thickness due to position irregularities in grinding rate in the grinding process in which the wiring layer is ground over a wide area. In order to prevent dishing from occurring, the upper limit of the wiring width is defined by a process rule.

[Patent Document 1]

Japanese Patent Application Laid Open No. H11-150114

In semiconductor circuits, in order to distribute a power supply line or a ground line to multiple portions, wiring having a certain level of width (which will be referred to as "distribution wiring" in this specification) is formed in vicinity of pads for wire bonding (bonding pads). Also, a line through which an analog or digital signal having a large amplitude is transmitted (which will be referred to as "power line" in this specification) needs to be formed with a certain level of line width. There is a need to form such a distribution wiring and a power line with low impedance. However, the dishing restricts the form of the wiring, leading to a problem in that it is difficult to reduce the impedance of such wiring.

SUMMARY OF THE INVENTION

The present invention has been made in order to solve such a problem. Accordingly, it is a general purpose of the present invention to provide low-impedance wiring in a semiconductor apparatus employing a copper wiring process.

An embodiment of the present invention relates to a semiconductor apparatus having a configuration in which multiple copper wiring layers and multiple insulating layers are alternately layered. The semiconductor apparatus includes wiring formed occupying a predetermined region. The wiring includes: a first wiring pattern formed in a first copper wiring layer, including multiple copper wiring members which are formed in parallel with predetermined intervals, and each of which has a rectangular shape extending in a first direction; and a second wiring pattern formed in a second copper wiring layer adjacent to the first copper wiring layer, including multiple copper wiring members which are formed in parallel with predetermined intervals, and each of which has a rectangular shape extending in a second direction orthogonal to the first direction. The region occupied by the first copper wiring pattern, the region occupied by the second copper wiring pattern, and the aforementioned predetermined region at least overlap. The first wiring pattern and the second wiring pattern are electrically connected to each other so as to have the same electric potential.

With such an embodiment, wiring patterns are provided to adjacent wiring layers such that they are arranged in the form of a mesh (waffle), and the adjacent wiring layers are electrically connected to each other. Thus, such an embodiment provides a single wiring pattern having an overall wide area and low impedance while maintaining a small wiring width of each wiring member so as to prevent dishing from occurring.

The semiconductor apparatus according to such an embodiment may further include a first via hole pattern which is arranged at positions at which the copper wiring members included in the first wiring pattern and the copper wiring members included in the second wiring pattern overlap, and which electrically connects the first wiring pattern and the second wiring pattern.

The semiconductor apparatus according to such an embodiment may further include: a third wiring pattern formed in a third copper wiring layer adjacent to the second copper wiring layer, including multiple copper wiring members arranged in parallel with predetermined intervals, and each of which has a rectangular shape extending in the first direction; and a second via hole pattern which is arranged at positions at which the second wiring pattern and the third wiring pattern overlap, and which electrically connects the second wiring pattern and the third wiring pattern.

Each of the multiple copper wiring members included in the first wiring pattern may overlap or may be overlaid with the corresponding one of the multiple copper wiring members included in the third wiring pattern.

The via holes included in the second via hole pattern may be arranged so as to overlap or be overlaid with the respective via holes included in the first via hole pattern, with the centers thereof matching one another.

The semiconductor apparatus according to such an embodiment may further include: a fourth wiring pattern formed in a fourth copper wiring layer adjacent to the third copper wiring layer, including multiple copper wiring members arranged in parallel with predetermined intervals, and each of which has a rectangular shape extending in the second direction; and a third via hole pattern which is arranged at positions at which the third wiring pattern and the fourth wiring pattern overlap, and which electrically connects the third wiring pattern and the fourth wiring pattern.

Each of the multiple copper wiring members included in the second wiring pattern may overlap or may be overlaid with the corresponding one of the multiple copper wiring members included in the fourth wiring pattern.

The via holes included in the third via hole pattern may be arranged so as to overlap or be overlaid with the respective via holes included in the second via hole pattern, with the centers thereof matching one another.

The semiconductor apparatus may further include: aluminum wiring formed in an aluminum wiring layer provided as an upper layer adjacent to the first copper wiring layer, and occupying approximately the same region as the aforementioned predetermined region; and a via hole pattern which connects the aluminum wiring and the first wiring pattern.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
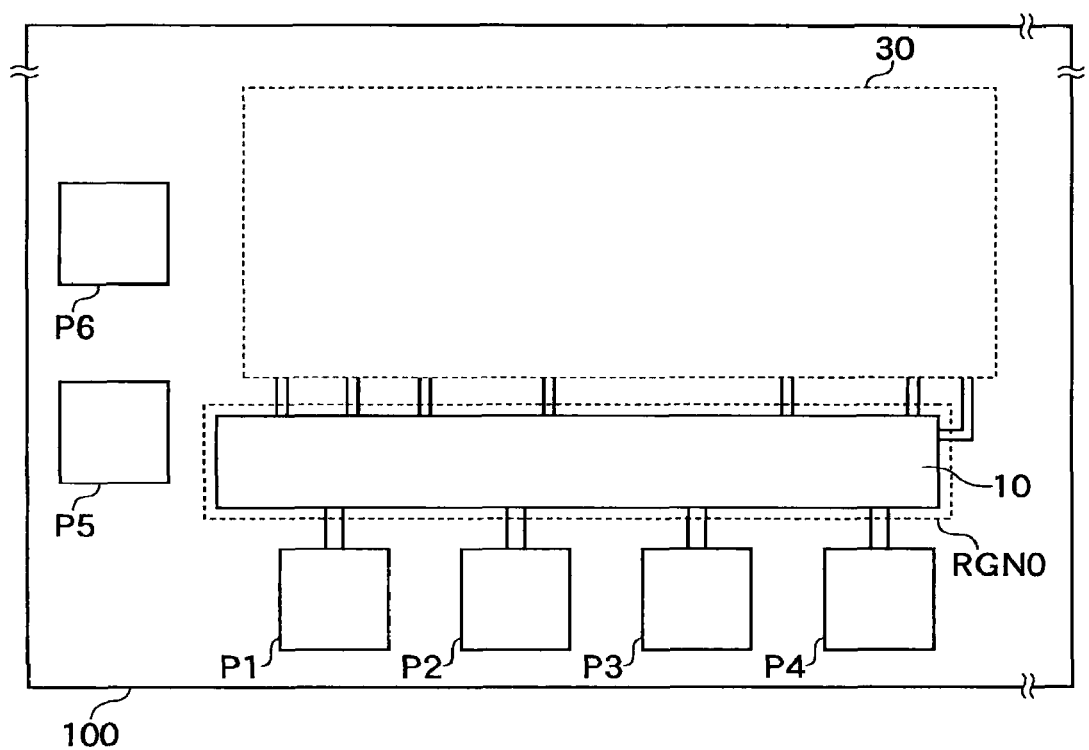
FIG. 1 is a plan view which shows a configuration of a semiconductor apparatus according to an embodiment.

FIG. 1 is a plan view which shows a configuration of a semiconductor apparatus 100 according to an embodiment. The semiconductor apparatus 100 has a configuration in which multiple copper wiring layers and multiple insulating layers are alternately layered. FIG. 1 shows a part of the uppermost layer viewed from the top. The semiconductor apparatus 100 includes pads P1 through P6, wiring 10, and a circuit portion 30. The pads P1 through P6 are provided in order to allow gold wires to be bonded. The circuit portion 30 includes circuit elements such as transistors, resistors, capacitors, etc., formed thereon. These circuit elements are connected to each other according to functions to be provided.

In the semiconductor apparatus 100 shown in FIG. 1, the multiple pads P1 through P4 generate the same electric potential. The pads P1 through P4 are electrically connected to each other via the wiring 10 formed occupying a predetermined region RGN0. For example, the pads P1 through P4 are: (1) pads via which power supply voltage is supplied; (2) pads via which ground voltage is supplied; (3) pads through which great current flows; or (4) pads to which voltage having a large amplitude is applied. Pads P5 and P6 are provided independent of the pads P1 through P4.

In the case of the aforementioned items (1) or (2), the pads P1 through P4 serve as input terminals. The power supply voltage (or ground voltage) applied to the pads P1 through P4 is supplied to the wiring 10 provided in the form of a land or a plate (which will also be referred to as "land wiring" or "plate wiring"). The power supply voltage (or ground voltage) thus applied is distributed to desired portions within the circuit portion 30 via ordinary wiring branching from the wiring 10.

Examples of the aforementioned items (3) or (4) includes: a case in which an output stage of a power amplifier which amplifies an audio signal is connected to these pads; a case in which an output stage of a computation amplifier for a large signal is connected to these pads; a case in which a power transistor used as a switching transistor is connected to these pads; and a push-pull output stage of a motor driver is connected to these pads. In such a case, the wiring 10 will also be referred to as "power wiring". It should be noted that the usage of the present invention is not restricted to such an arrangement.

The wiring 10, which functions as land (plate) wiring or power wiring, needs to be formed with low impedance. Accordingly, the wiring 10 is preferably formed with as large an area as possible. From this point of view, the wiring functioning as land wiring or power wiring will be referred to as "low-impedance wiring 10".

FIGS. 2A through 2E are plan views which shows a configuration of the low-impedance wiring 10. FIGS. 2A through 2E show the fifth wiring layer, the fourth wiring layer, the third wiring layer, the second wiring layer, and the first wiring layer, in this order. The fifth wiring layer L5 is a wiring layer which is formed as the uppermost layer of the semiconductor apparatus 100, and includes aluminum wiring formed therein, for example. On the other hand, each of the first wiring layer L1 through the fourth wiring layer L4 includes copper wiring formed therein.

Figure 2A:
FIG. 2A through FIG. 2E are plan views which show a configuration of low-impedance wiring.
Figure 2B:
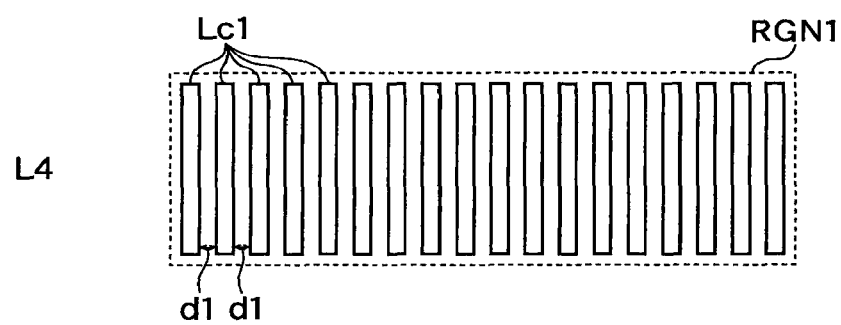

The fourth wiring layer L4 is the first copper wiring layer. As shown in FIG. 2B, in the first copper wiring layer (fourth wiring layer L4), multiple copper wiring members Lc1 are formed in parallel with predetermined intervals d1. Each of the multiple copper wiring members Lc1 has a rectangular shape extending in a first direction. The multiple copper wiring members Lc1 have the same shape. These multiple copper wiring members Lc1 will be referred to as "first wiring pattern".

Figure 2C:
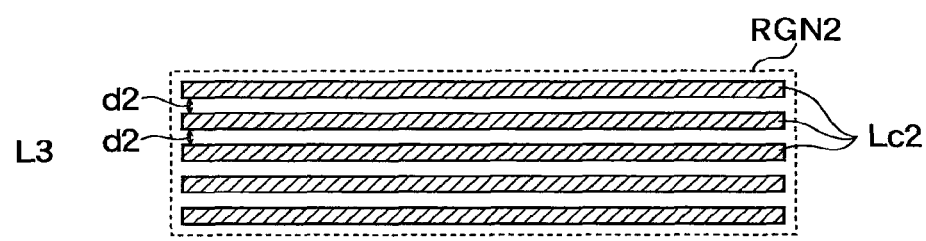

The third wiring layer L3 is the second copper wiring layer adjacent to the fourth wiring layer L4, i.e., the first copper wiring layer. As shown in FIG. 2C, in the second copper wiring layer (third wiring layer L3), multiple copper wiring members Lc2 are formed in parallel with predetermined intervals d2. Each of the multiple copper wiring members Lc2 has a rectangular shape extending in a second direction orthogonal to the first direction. The multiple copper wiring members Lc2 have the same shape. These multiple copper wiring members Lc2 will be referred to as "second wiring pattern".

The region RGN1 occupied by the first wiring pattern Lc1, the region RGN2 occupied by the second wiring pattern Lc2, and the predetermined region RGN0, at least overlap. In the example shown in FIG. 1, the regions RGN0, RGN1, and RGN2 match each other.

Figure 2D:
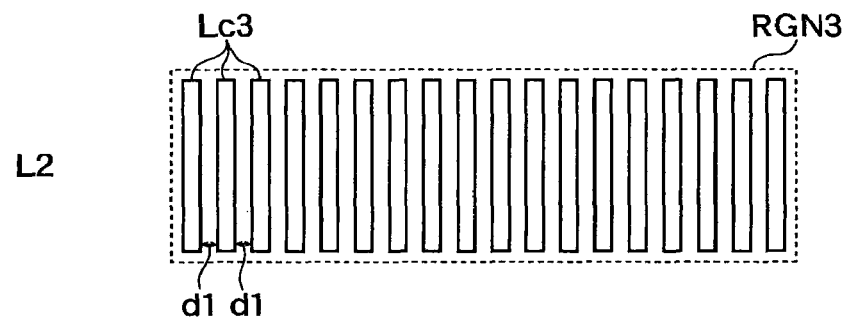

The second wiring layer L2 is the third copper wiring layer adjacent to the third wiring layer L3, i.e., the second copper wiring layer. As shown in FIG. 2D, in the third copper wiring layer (second wiring layer L2), multiple copper wiring members Lc3 are formed in parallel with the predetermined intervals d1. Each of the multiple copper wiring members Lc3 has a rectangular shape extending in the first direction. The multiple copper wiring members Lc3 have the same shape. These multiple copper wiring members Lc3 will be referred to as "third wiring pattern".

Figure 2E:
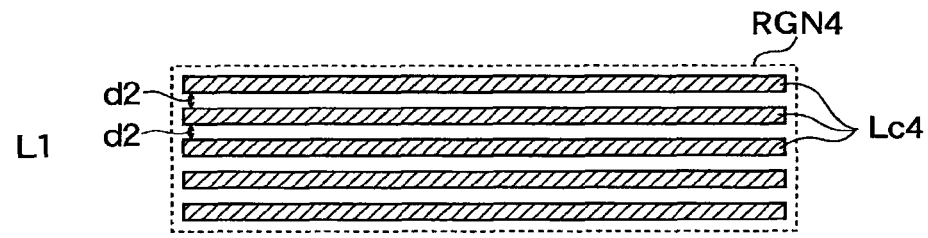

The first wiring layer L1 is the fourth copper wiring layer adjacent to the second wiring layer L2, i.e., the third copper wiring layer. As shown in FIG. 2E, in the fourth copper wiring layer (first wiring layer L1), multiple copper wiring members Lc4 are formed in parallel with the predetermined intervals d2. Each of the multiple copper wiring members Lc4 has a rectangular shape extending in the second direction. The multiple copper wiring members Lc4 have the same shape. These multiple copper wiring members Lc4 will be referred to as "fourth wiring pattern".

The fifth wiring layer L5 is an aluminum wiring layer formed adjacent to the fourth wiring layer L4. Aluminum wiring La, which occupies approximately the same region as the predetermined region RGN0 shown in FIG. 1, is formed in the fifth wiring layer L5. The aluminum wiring La and the first wiring pattern Lc1 are electrically connected to each other through multiple via holes. As many via holes as possible are preferably formed.

Figure 3:
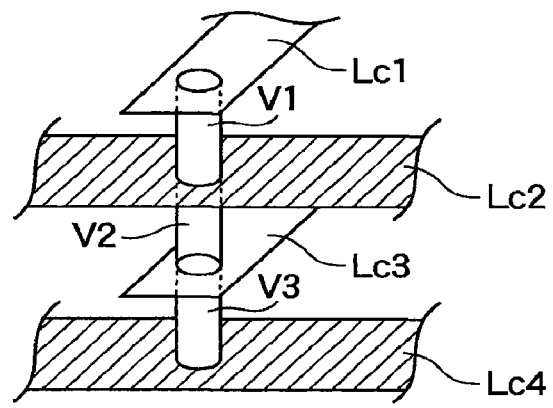
FIG. 3 is a diagram which shows a connection arrangement in which adjacent copper wiring layers are connected to each other.

FIG. 3 is a diagram which shows a connection arrangement in which adjacent copper wiring layers are connected to each other. The first wiring pattern Lc1 and the second wiring pattern Lc2 are electrically connected to each other via a first via hole pattern including at least one first via hole V1. The first via hole V1 is provided at a position (intersection) at which the first wiring pattern Lc1 and the second wiring pattern Lc2 overlap (i.e., intersect). FIG. 3 shows only a single first via hole V1. However, multiple first via holes are preferably formed at the intersections at which the first wiring pattern Lc1 and the second wiring pattern lc2 intersect.

Each of the multiple copper wiring members Lc1 included in the first wiring pattern overlaps the corresponding one of the multiple copper wiring members Lc3 included in the third wiring pattern. Similarly, each of the multiple copper wiring members Lc2 included in the second wiring pattern overlaps the corresponding one of the multiple copper wiring members Lc4 included in the fourth wiring pattern.

The second wiring pattern Lc2 and the third wiring pattern Lc3 are electrically connected to each other via a second via hole pattern including at least one second via hole V2. The second via hole V2 is provided at a position (intersection) at which the second wiring pattern Lc2 and the third wiring pattern Lc3 overlap (i.e., intersect). FIG. 3 shows only a single second via hole V2. However, multiple second via holes are preferably formed at the intersections at which the second wiring pattern Lc2 and the third wiring pattern Lc3 intersect.

The third wiring pattern Lc3 and the fourth wiring pattern Lc4 are electrically connected to each other via a third via hole pattern including at least one third via hole V3. The third via hole V3 is provided at a position (intersection) at which the third wiring pattern Lc3 and the fourth wiring pattern Lc4 overlap (i.e., intersect). FIG. 3 shows only a single third via hole V3. However, multiple third via holes are preferably formed at the intersections at which the third wiring pattern Lc3 and the fourth wiring pattern Lc4 intersect.

The via holes included in the second via hole pattern are arranged so as to overlap or be overlaid with the respective via holes included in the first via hole pattern, with the centers thereof matching one another. In the same way, the via holes included in the third via hole pattern are arranged so as to overlap or be overlaid with the respective via holes included in the second via hole pattern, with the centers thereof matching one another. That is to say, the wiring patterns formed in the multiple copper wiring layers are connected to each other through via holes, each of which is formed so as to pass through these multiple copper wiring layers.

As described above, by providing via holes at all the intersections at which a wiring pattern intersects with an adjacent wiring pattern formed such that it extends in a direction orthogonal to the direction in which the former wiring pattern extends, such an arrangement suitably reduces the impedance of the low-impedance wiring 10 without a risk due to the layout.

Figure 4:
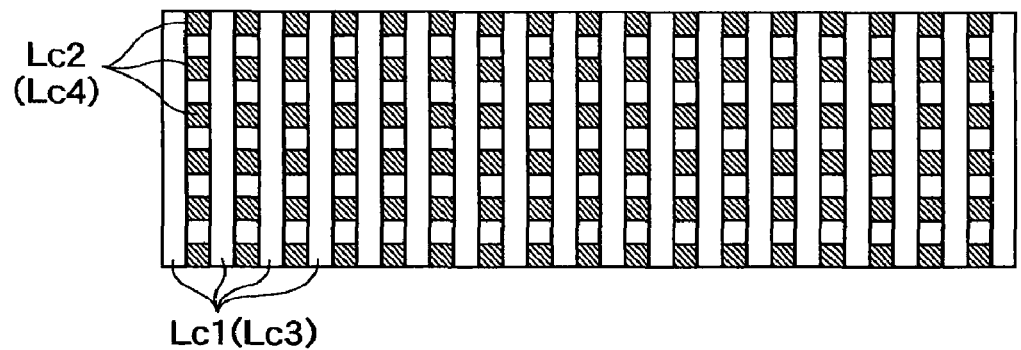
FIG. 4 is a diagram which shows a layout arrangement of layered wiring patterns that form the low-impedance wiring according to the embodiment.

FIG. 4 is a diagram which shows a layout arrangement of the wiring patterns that form the low-impedance wiring 10 according to the embodiment. As described above, the first wiring pattern Lc1 and the third wiring pattern Lc3 overlap or are overlaid with each other. On the other hand, the second wiring pattern Lc2 and the fourth wiring pattern Lc4 overlap or are overlaid with each other. Each of the wiring patterns Lc1 and Lc3 and each of the wiring patterns Lc2 and Lc4 are formed orthogonal to one another, in the form of a grid (waffle).

The above-described is the configuration of the semiconductor apparatus 100. The low-impedance wiring 10 is formed of wiring patterns formed in multiple wiring layers. Furthermore, the wiring members formed in the same wiring layer are formed with predetermined intervals. Accordingly, by suitably selecting the wiring width and the wiring interval for each wiring pattern, such an arrangement suppresses dishing, thereby improving the reliability.

Furthermore, by forming the wiring with as large the wiring width as possible and with as small the wiring interval as possible according to the process rule, such an arrangement reduces the impedance of the wiring.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiment regarding an arrangement in which the first wiring layer L1 employs aluminum wiring and the second wiring layer through the fifth wiring layer employ copper wiring. However, the present invention is not restricted to such an arrangement. The low-impedance wiring 10 may be configured of at least two wiring layers. That is to say, such an arrangement should include at least two wiring layers, e.g., the first wiring pattern Lc1 and the second wiring pattern Lc2 shown in FIGS. 2B and 2C. By increasing the number of wiring layers in addition to the first wiring pattern Lc1 and the second wiring pattern Lc2, the impedance can be further reduced.

Description has been made in the embodiment regarding an arrangement in which each wiring member included in the first wiring pattern Lc1 overlaps or is overlaid with the corresponding wiring member included in the third wiring pattern Lc3. Also, the first wiring pattern Lc1 and the third wiring pattern Lc3 may be arranged with an offset of half the wiring pitch such that they do not overlap. Also, the second wiring pattern Lc2 and the fourth wiring pattern Lc4 may be arranged in the same fashion.

While the preferred embodiments of the present invention have been described using specific terms, such description is for illustrative purposes only, and it is to be understood that changes and variations may be made without departing from the spirit or scope of the appended claims.

What is claimed is:

1. A semiconductor apparatus having a configuration in which a plurality of copper wiring layers and a plurality of insulating layers are alternately layered, and including wiring formed occupying a predetermined region, wherein the wiring includes:
   a first wiring pattern formed in a first copper wiring layer, including a plurality of copper wiring members which are formed in parallel with predetermined intervals, and each of which has a rectangular shape extending in a first direction; and
   a second wiring pattern formed in a second copper wiring layer adjacent to the first copper wiring layer, including a plurality of copper wiring members which are formed in parallel with predetermined intervals, and each of which has a rectangular shape extending in a second direction orthogonal to the first direction,
   and wherein the region occupied by the first copper wiring pattern, the region occupied by the second copper wiring pattern, and the aforementioned predetermined region at least overlap,
   and wherein the first wiring pattern and the second wiring pattern are electrically connected to each other so as to have the same electric potential.

2. A semiconductor apparatus according to claim 1, further including a first via hole pattern which is arranged at positions at which the copper wiring members included in the first wiring pattern and the copper wiring members included in the second wiring pattern overlap, and which electrically connects the first wiring pattern and the second wiring pattern.

3. A semiconductor apparatus according to claim 2, further including:
   a third wiring pattern formed in a third copper wiring layer adjacent to the second copper wiring layer, including a plurality of copper wiring members arranged in parallel with predetermined intervals, and each of which has a rectangular shape extending in the first direction; and
   a second via hole pattern which is arranged at positions at which the second wiring pattern and the third wiring pattern overlap, and which electrically connects the second wiring pattern and the third wiring pattern.

4. A semiconductor apparatus according to claim 3, wherein each of the plurality of copper wiring members included in the first wiring pattern overlaps or is overlaid with the corresponding one of the plurality of copper wiring members included in the third wiring pattern.

5. A semiconductor apparatus according to claim 4, wherein the via holes included in the second via hole pattern are arranged so as to overlap or be overlaid with the respective via holes included in the first via hole pattern, with the centers thereof matching one another.

6. A semiconductor apparatus according to claim 3, further including:
   a fourth wiring pattern formed in a fourth copper wiring layer adjacent to the third copper wiring layer, including a plurality of copper wiring members arranged in parallel with predetermined intervals, and each of which has a rectangular shape extending in the second direction; and
   a third via hole pattern which is arranged at positions at which the third wiring pattern and the fourth wiring pattern overlap, and which electrically connects the third wiring pattern and the fourth wiring pattern.

7. A semiconductor apparatus according to claim 6, wherein each of the plurality of copper wiring members included in the second wiring pattern overlaps or is overlaid with the corresponding one of the plurality of copper wiring members included in the fourth wiring pattern.

8. A semiconductor apparatus according to claim 7, wherein the via holes included in the third via hole pattern are arranged so as to overlap or be overlaid with the respective via holes included in the second via hole pattern, with the centers thereof matching one another.

9. A semiconductor apparatus according to claim 1, further including:
   aluminum wiring formed in an aluminum wiring layer provided as an upper layer adjacent to the first copper wiring layer, and occupying approximately the same region as the aforementioned predetermined region; and
   a via hole pattern which connects the aluminum wiring and the first wiring pattern.

* * * * *